United States Patent
Koguchi et al.

[11] Patent Number: 5,932,880
[45] Date of Patent: Aug. 3, 1999

[54] SCINTILLATOR DEVICE AND IMAGE PICKUP APPARATUS USING THE SAME

[75] Inventors: Masanari Koguchi, Kodaira; Hiroshi Kakibayashi, Nagareyama; Tetsuya Ooshima, Kokubunji; Kenji Sameshima, Hachioji; Tatsuo Makishima, Tokyo; Keiichi Kanehori, Sayama; Hiroyuki Shinada, Chofu, all of Japan

[73] Assignee: Hitachi, Ltd., Tokyo, Japan

[21] Appl. No.: 08/850,480

[22] Filed: May 5, 1997

[30] Foreign Application Priority Data

May 9, 1996 [JP] Japan .................................. 8-114572

[51] Int. Cl.⁶ .................................................. H01J 29/20
[52] U.S. Cl. ............................................................ 250/397
[58] Field of Search ............................... 250/397, 396 R, 250/361 R, 363.01, 483.1, 367, 299

[56] References Cited

U.S. PATENT DOCUMENTS

| | | | |
|---|---|---|---|
| 4,195,226 | 3/1980 | Robbins et al. | 250/361 R |
| 4,363,969 | 12/1982 | Ong | 250/367 |
| 4,398,090 | 8/1983 | Eloy et al. | 250/299 |

FOREIGN PATENT DOCUMENTS 58-206029  12/1983  Japan .

OTHER PUBLICATIONS

"Ultramicroscopy", vol. 52, 1993, pp. 7–20.
"Ultramicroscopy", vol. 54, 1994, pp. 293–300.

*Primary Examiner*—Kiet T. Nguyen
*Attorney, Agent, or Firm*—Fay, Sharpe, Beall, Fagan, Minnich & McKee

[57] ABSTRACT

A scintillator device and an image pickup apparatus using the scintillator, in which the scintillator for converting an input particle or electron beam image into an optical image is applied with a voltage between electrodes formed at the input plane of the electron beam and the output plane of scintillation. This voltage generates an electric field in the scintillator so that scattering of a charged particle beam in the scintillator is prevented and the resolution and S/N ratio can be improved while retaining a large amount of scintillation. Accordingly, the shift amount of low energy charged particle beams from the incident axis, which greatly influences degradation of the resolution and S/N ratio, can be suppressed.

18 Claims, 9 Drawing Sheets

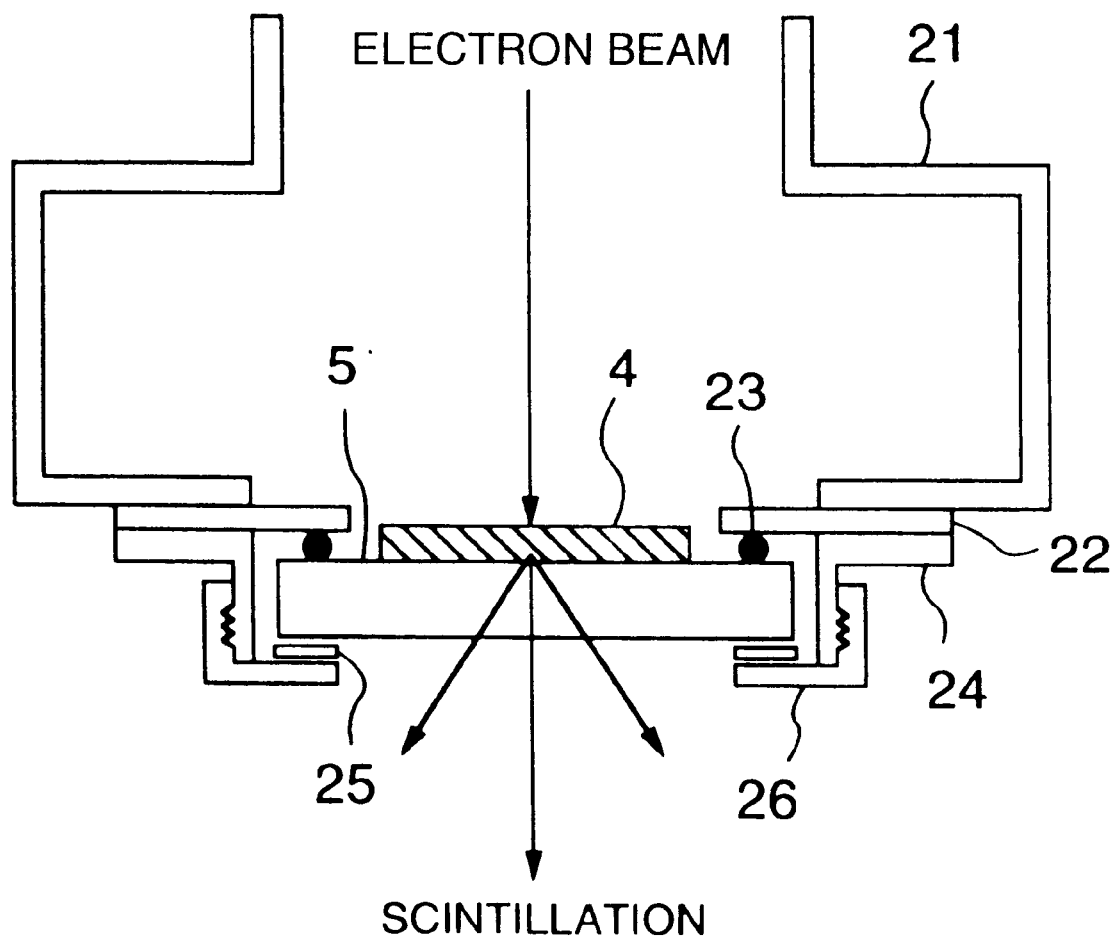

SCINTILLATOR DEVICE AND IMAGE PICKUP APPARATUS USING THE SAME

BACKGROUND OF THE INVENTION

1. Field of the Invention

The present invention relates to a scintillator device capable of picking up an image at high sensitivity and high precision, an image pickup apparatus using the scintillator, and a scanning type electron microscope (SEM) for inspection using the scintillator.

2. Description of the Related Art

An example of the image pickup apparatus using a scintillator is an electron microscope camera as disclosed in "Ultramicroscopy", Vol. 52, pp. 7–20 (1993). With this image pickup apparatus, an electron beam image is converted into an optical image by the scintillator, and this optical image is focused on an image pickup element (in this paper, a charge-coupled device (hereinafter abbreviated as CCD), and in others an image pickup tube) by using an optical element (in this paper, an optical fiber plate, and in others an optical lens) to take the object image.

An example of a conventional scintillator whose plates are applied with a voltage is a cathode ray tube type scintillator disclosed in JP-A-58-206029. According to this invention, a photoconductive film and a metal reflection film are formed on the electron beam input plane, and a transparent electrode film is formed on the scintillation output plane. A voltage about 10 V is applied between the metal reflection film and transparent electrode film. As an electron beam enters the scintillator, scintillation occurs due to the cathode luminescence phenomenon. This scintillation emits to the outside via the transparent electrode, and a fraction thereof enters the photoconductive film which has the characteristics of lowering its resistance by light incidence. Therefore, almost all the applied voltage between the metal reflection film and transparent electrode film is applied to the scintillator when light enters. Accordingly, the electroluminescence phenomenon occurs in the local region of the scintillator where electron beams entered, and the scintillator in this region generates light in addition. Namely, light generated by the cathode luminescence phenomenon is superposed upon light generated by the electroluminescence phenomenon so that generated light has a high brightness as compared to light generated only by the scintillator.

A charged particle beam containing image information is scattered in the scintillator by electromagnetic force of atoms having mainly positive charges so that the light generating area has some broad area about the incident axis of the charged particle beam. As a result, even if an image has a sufficient resolution before it enters the scintillator, the image becomes so-called out-of-focus or unsharp when it is converted into an optical image in the scintillator. The electron beam completely loses its image information because of great scattering forms random noises of the image and lowers an S/N ratio greatly.

In order to prevent the resolution and S/N ratio from being lowered, the charged particle beam is arranged to be output from the scintillator before it shifts largely from the incident axis. For example, as disclosed in "Ultramicroscopy", Vol. 54, pp. 293–300 (1994), the scintillator is made thin enough so that the spread width of an electron beam can be suppressed to some degree. This method, however, is associated with the following problems. An electron beam is subjected to electrolytic dissociation in the scintillator and electrons themselves gradually lose their energy while imparting the energy to the scintillator. The scintillator generates scintillation by receiving the energy. The amount of imparted energy increases in proportion to the transmission length of the electron beam in the scintillator. Therefore, if the scintillator is made thin in order to prevent the resolution from being lowered, the amount of scintillation is reduced correspondingly.

The prior technology (JP-A-58-206029) does not aim to control the electron beam direction so that the comparison with this invention is not proper from the point of view of its essence. However the following problems will be explained in terms of the direction control of an electron beam.

For the conventional technology of applying a voltage between the electrodes sandwiching the photoconductive film and scintillator, the photoconductive film is essential. However, if the photoconductive film is used, a large number of electron beams are absorbed in this photoconductive film so that the amount of scintillation is lowered and the electron beam is scattered greatly to present a serious issue of lowering the resolution. The voltage applied between the electrodes is divided by the scintillator and the photoconductive film and the voltage is not applied efficiently to the scintillator, being unable to provide the advantageous effects of electron beam direction control which is the object of this invention. In the conventional applications, in order to generate electroluminescence, an a.c. voltage is required or an alternative application of a d.c. voltage and a zero voltage is required. Only the d.c. voltage cannot generate electroluminescence. However, if the applied voltage becomes zero, the effects of direction control of an electron beam are completely eliminated, and in addition in the case of the a.c. voltage, the electron beam is spread when the polarity is reversed, lowering the resolution. Furthermore, although the applied voltage is in the order of as high as about 10 V, this voltage is too low for the direction control of a charged particle beam which is the object of the invention. For example, a typical acceleration voltage of an electron beam for an electron microscope is 100 kV to 300 kV, and the voltage of about 10 V is impossible to control the electron beam direction.

SUMMARY OF THE INVENTION

It is an object of the present invention to provide an electron microscope having a scintillator capable of generating a large amount of scintillation while providing a high resolution and a high S/N ratio, and an SEM for inspection having such a scintillator.

According to this invention, electrodes are formed on the electron beam output plane and scintillation radiation plane of a scintillator, and a high d.c. voltage is applied between the electrodes to control the scatter direction of an electron beam entered the scintillator to be in the direction of the scintillator radiation direction.

BRIEF DESCRIPTION OF THE DRAWINGS

FIG. 5 is a schematic diagram showing the mount structure of a scintillator of this invention on an electron microscope.

DESCRIPTION OF THE PREFERRED EMBODIMENTS

Figure 1A:
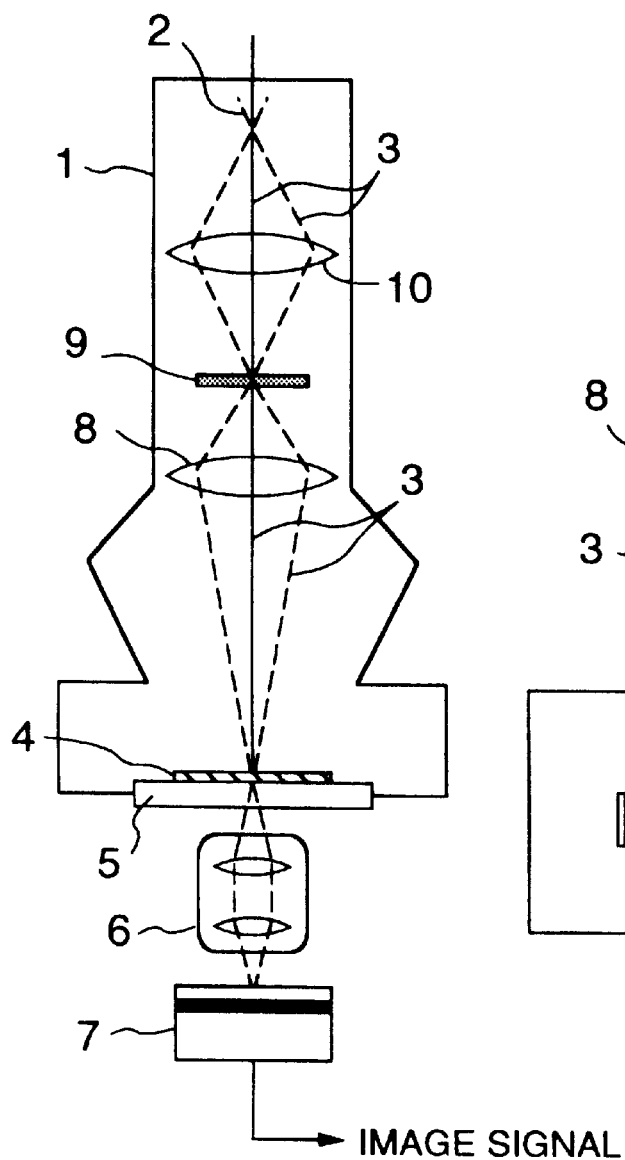
FIGS. 1A and 1B are schematic diagrams showing examples of an electron microscope with an image pickup apparatus.
Figure 1B:
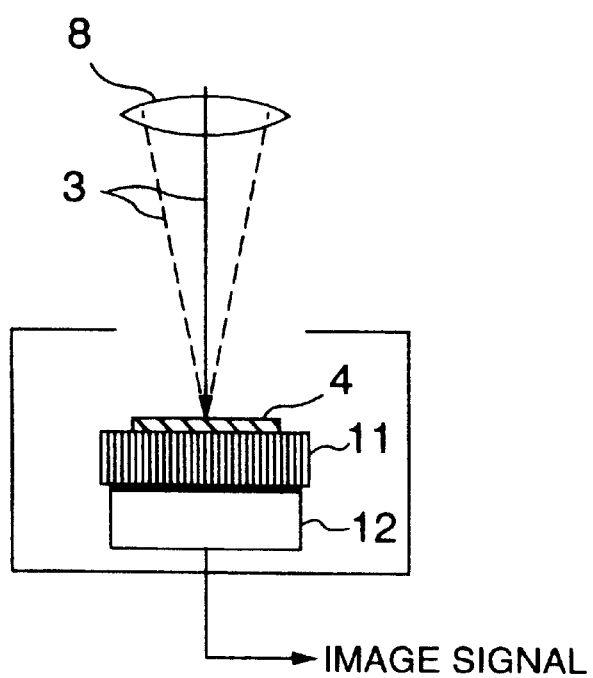

The structures of known systems described with respect to the conventional technology will be first described with reference to FIGS. 1A and 1B and FIGS. 2A and 2B. FIGS. 1A and 1B show the overall structure of an electron microscope in which an image is focused by a lens or an optical fiber plate onto the photo-detecting plane of an image pickup element. In the electron microscope 1, an electron beam 3 radiated from an electron source 2 is applied via an objective lens 10 to a specimen 9. The electron beam receives an interaction with the specimen such as refraction which reflects the crystal structure and composition of the specimen, and passes through the specimen 9 which is formed in advance as a thin film. The electron beam passed through the specimen 9 is focused via the electron lens 8 such as an intermediate lens and a projection lens onto a scintillator 4 formed to be a thin film and placed on a glass window 5.

In FIG. 1A, an image is formed by an image pickup tube 7 using a lens, and in FIG. 1B an image is formed by a charge-coupled device (CCD) 12 via an optical fiber plate 11. The optical fiber plate 11 is made of a bundle of optical fibers. In both cases, an electron beam image is converted into an optical image by the thin film scintillator 4 and this optical image is picked up.

Figure 2A:
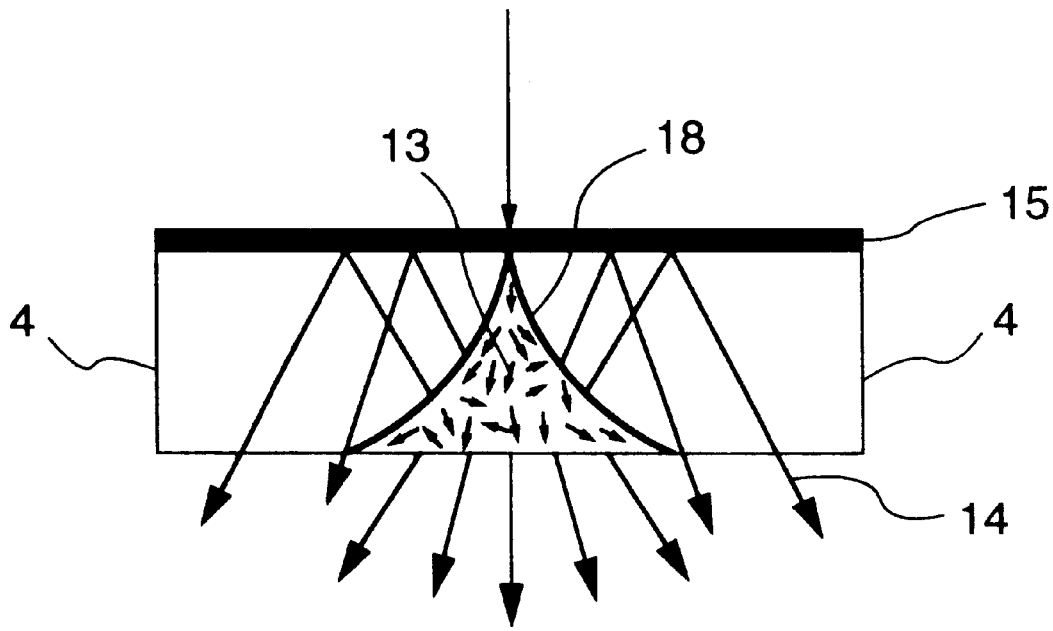
FIG. 2A is an enlarged view showing the structure of a conventional scintillator.
Figure 2B:
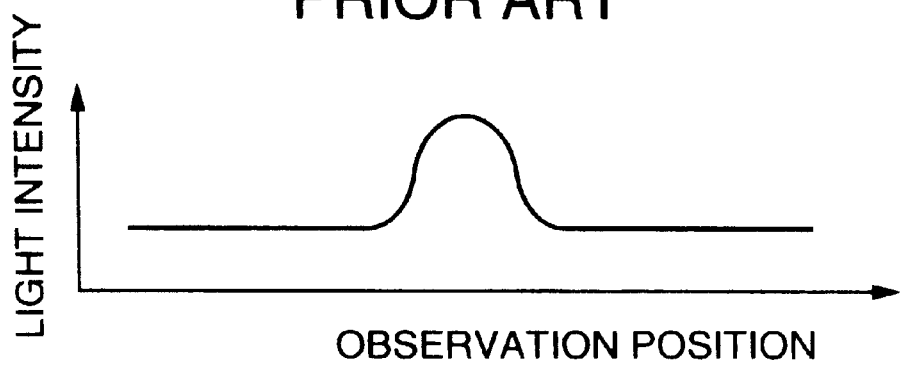
FIG. 2B is a diagram showing the distribution of spread electron beams.

FIG. 2A is an enlarged view of the scintillator 4. In FIG. 2A, the trajectory 13 of an electron beam entered the scintillator at one point, the envelope 18 indicating the area of electron beams, and the optical path of generated scintillation 14 are shown. In most of electron microscopes, the electron beam is accelerated by 100 kV to 300 kV. In this range of acceleration energy, the thickness (range) of the scintillator through which the electron beam can transmit is about 20 to 100 µm. Therefore, the thickness of the scintillator 4 is regulated to a half of the range so that as shown in FIG. 2A, the electron beam is emitted to the outside of the scintillator 4 before it stops fully. The electron beam loses its energy in the scintillator 4 by electrolytic dissociation. On the other hand, the scintillator receives this energy so that electrons in the valence band are excited to the conduction band and holes are left in the valence band. Generated electron-hole pairs recombine in a short time. At this recombination, scintillation having an energy (wavelength) characteristic to the scintillator material is generated. Regulating the range of the scintillator 4 to about a half and shortening the transmission distance of the electron beam result in a reduced amount of scintillation in the scintillator 4. Since scintillation is generated omnidirectionally, scintillation directly output from the plane (called an output plane) confronting the input plane of the electron beam is 50% or smaller of the total scintillation. Generally, a photosensitive element is disposed on the output plane side to detect scintillation. Therefore, in order to improve the detection efficiency as much as possible, a thin reflection film 15 has been conventionally disposed at the input plane (as described in "Ultramicroscopy", Vol. 54, pp. 293–300 (1994)). This reflection film 15 is generally made of a vapor-deposited aluminum film in order to maintain a sufficient light reflectivity while rarely lowering the energy of the electron beam.

The area of generated scintillation is three-dimensionally distributed along the trajectory of the electron beam. The electron beam incident upon one point such as shown in FIG. 2A has a scintillation distribution shown in FIG. 2B (the abscissa represents a distance of the electron beam from the incident axis), and this scintillation distribution is mainly caused by the spread area of the electron beam in the scintillator 4.

The embodiments of the invention will be described in the following. In order to understand the behavior of an electron beam in the scintillator, the following three factors (1) to (3) are first required to study.

(1) Mean Free Path

A mean free path ($\lambda$) is a mean distance by which an electron propagates before it is scattered once. When the effects of inelastic scattering are taken into consideration, the energy dependency of the mean free path is given by:

$$\lambda(E) = 4\beta(\beta+1)E^2 A / (\pi N_A \rho Z(Z+1)e^4) = a + bE \quad (1)$$

$$\beta = 5.44\, Z^{(2/3)}/V \quad (\beta: \text{screening parameter}) \quad (2)$$

where E is an electron energy (=eV/300), A is an atomic weight, Z is an atomic number, e is a charge of an electron, NA is an Avogadro's number, and $\rho$ is a density.

The following conclusion can be derived from the above equations.

(a) The scattering probability becomes larger and the amount of generated scintillation in the scintillator increases more, the lower the energy of the electron beam is.

(2) Energy Loss

The electron beam gradually and continuously loses its energy. The energy loss amount (dE/dx) of an electron beam having an energy (E) per unit length is given from the Bethe formula by:

$$dE/dx(E) = 2\pi e^4 N_A \rho Z / (EA) \ln(1.66 E/J) \quad (3)$$

$$J = 14Z[1 - \exp(-0.1Z)] + 75.5 Z/Z^{(Z/7.5)} - Z^2/(100 + Z) \quad (4)$$

$$\text{If } E < 300 \text{ keV}, dE/dx(E) \text{ (keV/}\mu\text{m)} = 100/E \text{ (keV)} \quad (5)$$

The following conclusions can therefore be obtained.

(b) The electron having a lower energy imparts a large energy to the scintillator.

(c) Therefore, the amount of generated scintillation is larger at near the electron having a lower energy.

(3) Scattering Angle

If the electron beam having an energy (E) is scattered by an angle ($\omega$) from the propagation direction, the probability of scattering in the direction between $\omega$ and $\omega + d\omega$ is given by the scattering cross section ($d\sigma/d\Omega(E)$):

$$d\sigma/d\Omega(E) = Z(Z+1)e^4/4E^2/(1 - \cos\omega + 2\beta)^2 \quad (6)$$

-continued $$= a / [E(1 - \cos\omega) + b]$$

The following conclusion can be derived from the above equation.

(d) The lower energy the electron has, it is more likely to be scattered.

In summary of the above conclusions (a) to (d), the following conclusion can be derived.

(e) The electron continuously loses its energy and the scintillator increases the amount of generated scintillation at the position more remote from the incident axis, than the energy is lowered. Such a stray electron beam has no more image information, covers the whole image as random background noises, and considerably lowers the resolution and S/N ratio. In other words, if the electron beam just before stopping is removed from the scintillator or the electron beam is controlled not to shift from the incident axis in the scintillator, the resolution and S/N ratio can be improved significantly.

In the above, an electron beam has been described. The above conclusion (e) is also applicable to other charged particle beams having different masses and charges.

1st Embodiment

Figure 3A:
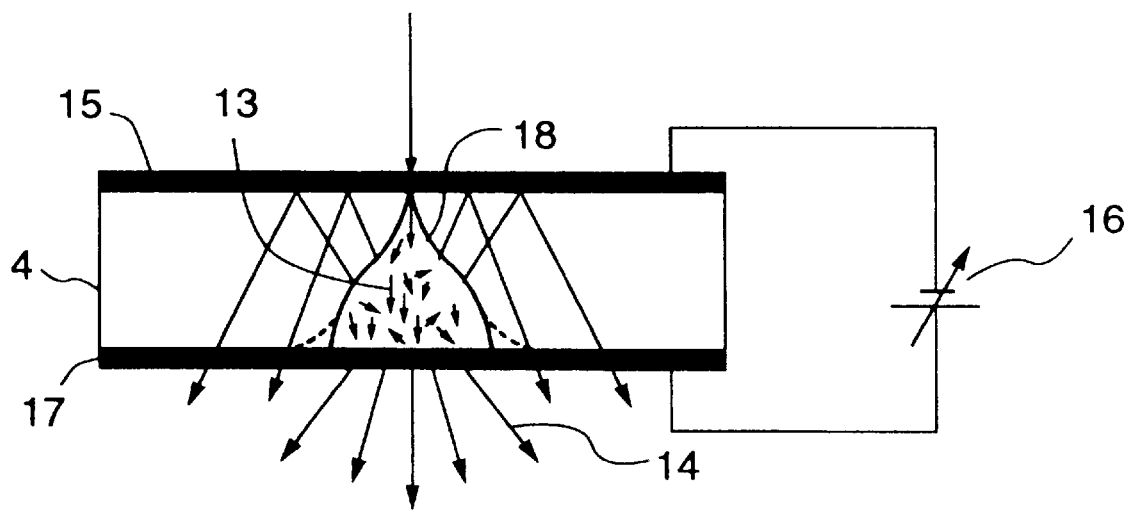
FIG. 3A is an enlarged view showing the structure of a scintillator according to the present invention.
Figure 3B:
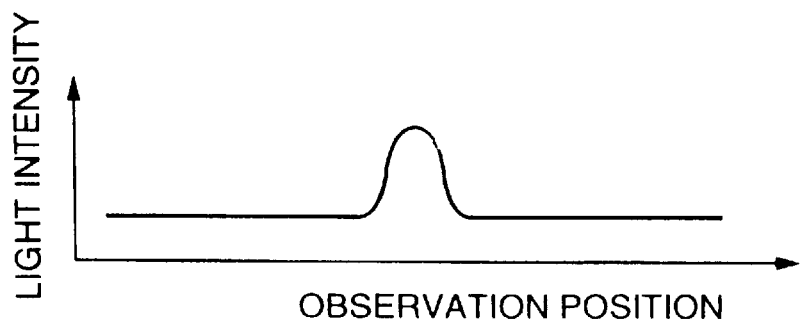
FIG. 3B is a diagram showing the distribution of the spread electron beams.

According to the present invention, a novel structure to be described below is incorporated in the scintillator 4 having the conventional structure. FIGS. 3A and 3B illustrate the first embodiment of the invention. In this invention, a transparent electrode 17 is provided on the output plane side of the scintillator. A reflection film 15 similar to the conventional scintillator is used also as an electrode. A d.c. power source 16 is connected between the reflection film 15 and the novel transparent electrode 17 to apply a voltage between both the electrodes. In this embodiment, an electron beam is pulled toward the incident axis direction and a high voltage is applied to the transparent electrode to prevent a beam spread. An optimum voltage to be applied changes with the energy of an electron beam and a thickness of the scintillator. It is therefore desired to use a variable d.c. voltage power source 16. The transparent electrode 17 which is intended to provide both conductivity and light transparent effects is preferably made of tin oxide ($SnO_2$), indium oxide ($In_2O_3$), titanium oxide ($TiO_2$), or the like.

Figure 4A:
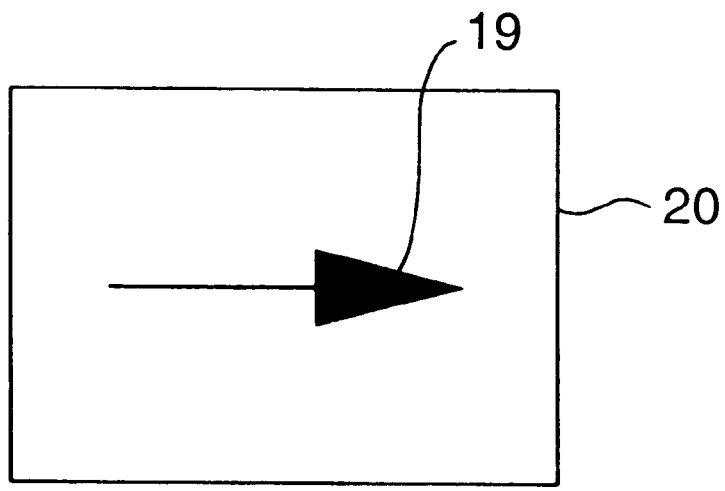
FIG. 4A shows an image taken directly with electron beams.
Figure 4B:
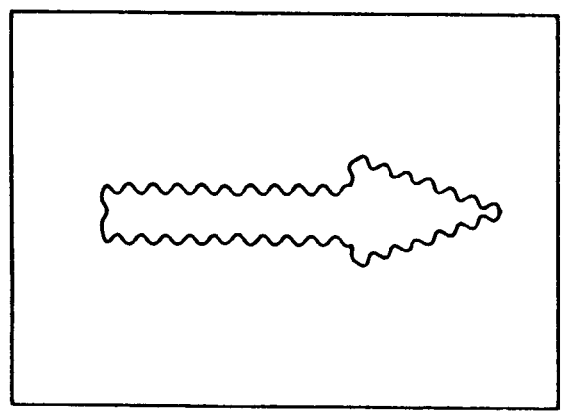
FIGS. 4B and 4C are images after electron-photon conversion according to the conventional invention and according to present invention, respectively.
Figure 4C:
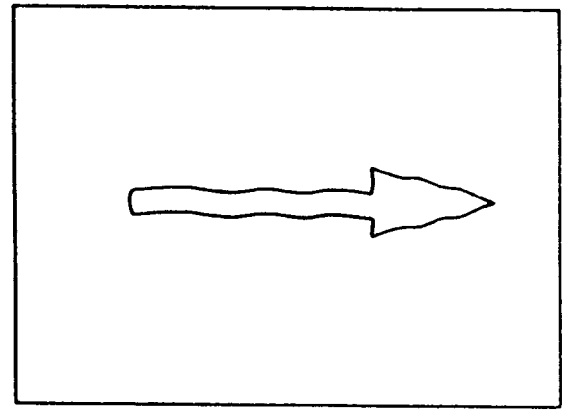

As with the conclusion (e), the lower energy the electron beam has, the influence of lowering the resolution and S/N ratio becomes more conspicuous. Therefore, even if a low voltage is applied between the electrodes, an improvement on the resolution and S/N ratio can be expected greatly. Namely, even if the input electron beam has an energy of 300 keV, the applied voltage is not necessary to be several 100 keV, but the applied voltage of several 100 V to several kV is sufficient for providing the effects of improving the resolution and S/N ratio. A d.c. power source of this kind can be easily available in the market and realized at a low cost. As shown in FIG. 3A, although the trajectory of a high energy electron beam immediately after impinging rarely changes, the trajectory 13 of electron beams having a low energy which greatly influence the deterioration of the resolution and S/N ratio are made not to shift from the incident axis in the scintillator and electron beams just before stoppage having a low energy are removed as many as possible from the scintillator. Also in FIG. 3A, the trajectory 13 of an electron beam incident upon one point, an envelope 18 indicating the area in which an electron beam exists, and light paths of generated scintillation 14 are shown. The scintillation distribution by a point incident electron beam is shown in FIG. 3B (in which the abscissa represents a distance of an electron beam from the incident point). This distribution is sharper than that shown in FIG. 2B. Therefore, the unsharpness of an image generated in the scintillator is alleviated and the S/N ratio is improved. The improved resolution will be explained with reference to FIGS. 4A to 4C. FIG. 4A shows an electron image of an arrow-shaped imaging object 19 magnified by the electron microscope and projected upon a screen 20. Since the electron image is an image before electron-photon conversion, the influence of unsharpness of an image generated in the scintillator is less and a sharp arrow image is obtained. FIG. 4B shows an image picked up by using a conventional scintillator shown in FIG. 2A. This image of the same arrow has a larger width and unsharpness thereof is more than that shown in FIG. 4A. FIG. 4C shows an image picked up by using the embodiment scintillator shown in FIG. 3A. This image has an intermediate width between those shown in FIGS. 4A and 4B and the resolution is suppressed from being lowered.

In the above embodiment, although an electron beam is used, the same description is applicable to other particles irrespective of a presence/absence of electric charges. When an ion beam, an atom beam, or a molecule beam impinges, the orbital electrons of each particle are taken off in the scintillator 4 and becomes a charged particle beam. Charges may be positive or negative. In the latter case, similar to the electron beam, the input plane of the particle beam is applied with the negative potential and the output plane of generated scintillation is applied with the positive potential. Conversely, in the former case, the input plane of the particle beam is applied with the positive potential and the output plane of generated scintillation is applied with the negative potential. With this potential application, the scintillation area can be regulated and the resolution can be prevented from being lowered.

2nd Embodiment

FIG. 5 is a detailed cross sectional view showing a mount structure of a scintillator on an electron microscope as viewed in the horizontal direction. Under an observation chamber 21 of an electron microscope, a hole of usually several ten inches diameter is provided for installing a camera and other various analyzing apparatuses. An adapting flange 22 for mounting the scintillator is mounted near the hole. A support flange 24 with threads is mounted on the adapting flange 22. A cap 26 is threaded with the adapting flange 22 to squeeze upward a glass substrate 5. A buffer 25 such as a thin Teflon plate is inserted between the cap 26 and glass substrate 5 so that an excessive force is not applied to the glass substrate when the cap is threaded with the support flange 24. As will be detailed with FIG. 6, the outer surface of the glass substrate 5 is covered with a thin aluminum film while maintaining the surface sufficiently flat. A vacuum seal 23 (generally O-ring made of resin) is inserted between the glass substrate 5 and adapting flange 22 so that the inside of the observation chamber 21 of the electron microscope can retain sufficient vacuum.

3rd Embodiment

Figure 6A:
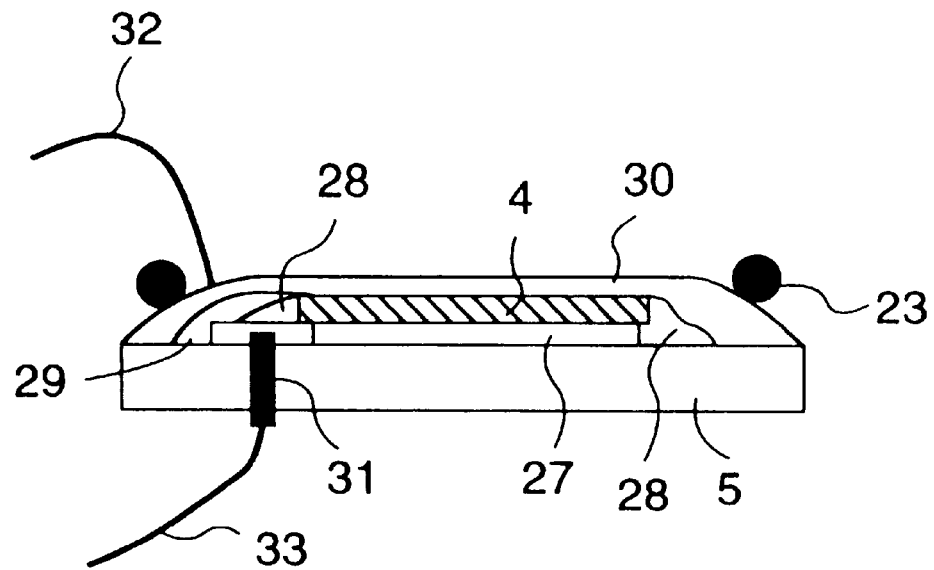
FIGS. 6A and 6B are diagrams showing the details of the scintillator of this invention.
Figure 6B:
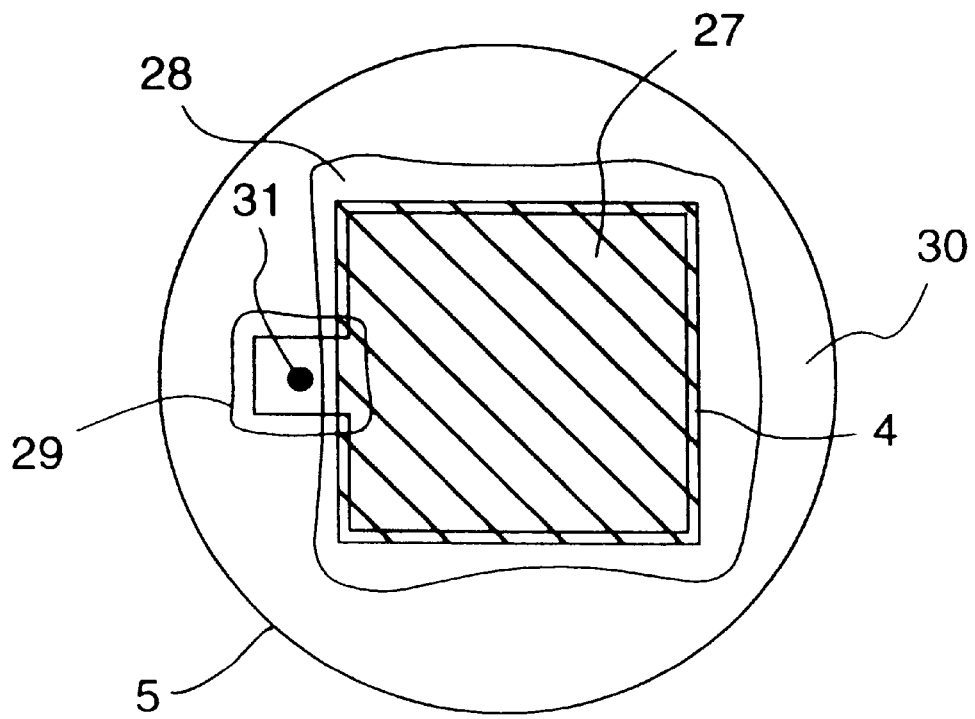

With reference to FIGS. 6A and 6B, the more detailed structure of a scintillator and its manufacture processes and a method of applying a voltage between electrodes according to the third embodiment will be described. FIG. 6A is a side view partially in cross section showing a scintillator mounted on a glass substrate, and FIG. 6B is a schematic plan view of the structure shown in FIG. 6A. First, a glass substrate 5 having sufficiently flat mirror surfaces is prepared. A conductive current supply pin 31 is embedded in a hole formed in the glass plate at its peripheral area. Some of such glass substrates are available in the market. A transparent electrode 27 is vapor deposited on the glass substrate 5 by sputtering or the like. The transparent electrode 27 may be made of tin oxide ($SnO_2$), indium oxide ($In_2O_3$), titanium oxide ($TiO_2$), or the like.

In this embodiment, the transparent electrode 27 is generally square and has a pad area extending to the current supply pin 31. A scintillator 4 is adhered to the square area of the transparent electrode 27 with non-conductive glue 28. The adhesive surface of the scintillator 4 is polished to have a mirror surface before the scintillator 4 is adhered. After adhesion, the scintillator 4 is roughly lapped to a desired thickness and thereafter it is polished to have a mirror surface. At the adhesion process, generally the glue permeates through the peripheral area of the scintillator 4. In this embodiment, this permeated glue 28 is positively used for the insulating member between the electrodes. This permeated glue 28 is also lapped to become flush with the scintillator 4 when the scintillator is roughly lapped. A non-conductive material 29 is coated on the pad area near the current supply pin 31 of the transparent electrode 27, and then an electrode 30 is deposited over the whole surface of the glass substrate 5. The non-conductive material 29 may be the same material as the non-conductive glue 28. The electrode 30 is preferably a vapor-deposited aluminum thin film easy to be formed. The electrode 30 may be a vapor-deposited or sputtered metal film having a good conductivity such as gold, silver, and platinum. In order to suppress a spread of an electron beam in the scintillator 4, it is preferable to electrically ground the electrode 30 and apply a high voltage to the transparent electrode 27. To this end, the electrode 30 is connected to a ground wire 32 and the current supply pin 31 is connected to a high-voltage wire. The ground wire may be connected, for example, to the nearby observation chamber 21 or adapting flange 22 of the electron microscope to establish electric ground. The high-voltage wire 33 at the outside of the vacuum in the microscope is connected to the d.c. power source 16 (FIG. 3A).

4th Embodiment

Figure 7:
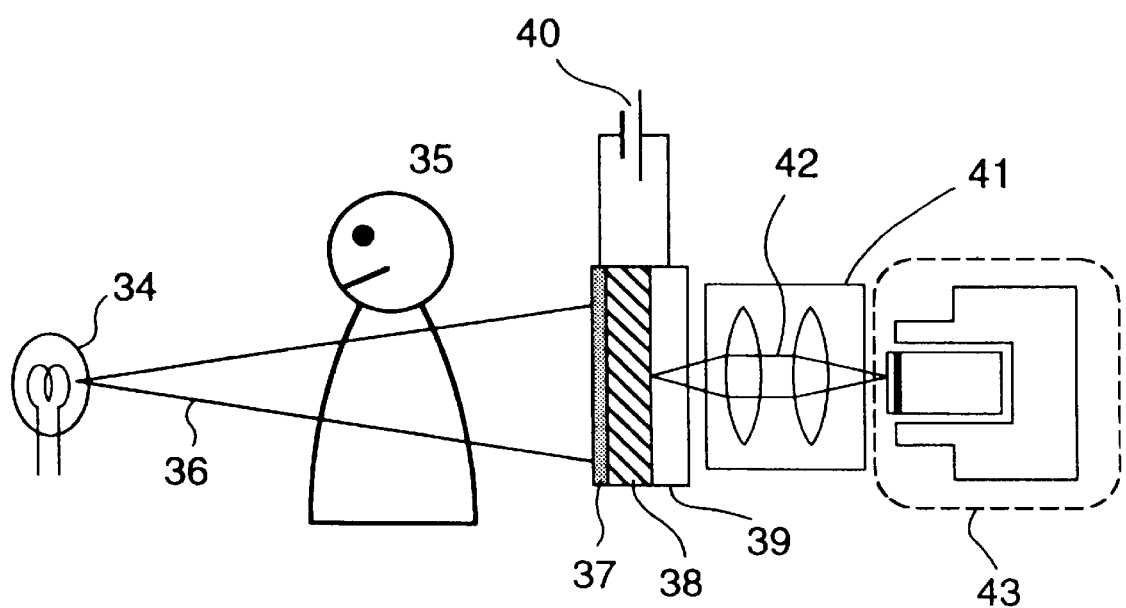
FIG. 7 shows the structure of system using x-ray tomography of this invention.

In the above embodiments, an electron microscope is used in which both the input particle beam and a charged particle beam in the scintillator are electron beams. In this embodiment, an input particle beam used is photon. FIG. 7 illustrates X-ray tomography mainly used for medical purposes. In X-ray tomography, X-rays 36 generated by an X-ray generator 34 are exposed to a patient 35 to pick up X-rays transmitted through the patient with a film or a camera. In this embodiment, a camera is used. The transmitted x-rays cannot be detected with a camera 43 because of short wavelengths. Therefore, the X-rays are converted into light rays 42 having a wavelength near visual light by a scintillator 38 and focused by an optical lens 41 onto the focus plane of the camera 43. In this case, an X-ray is once converted into a high speed electron beam by the photoelectric effect, and then the electron beam excites the scintillator to generate scintillation. Since image information held by the X-rays is converted into electron beams having a high energy in the thickness direction of the scintillator, this phenomenon is similar to the embodiments illustrated in FIGS. 2A to 3B. Therefore, also in this embodiment, an electrode 37 and a transparent electrode 39 sandwiching the scintillator 38 are provided and connected to a d.c. power source 40, with the transparent electrode 39 being applied with the positive potential. In this manner, a spread of a high speed electron beam can be suppressed in the scintillator 38.

5th Embodiment

Figure 8:
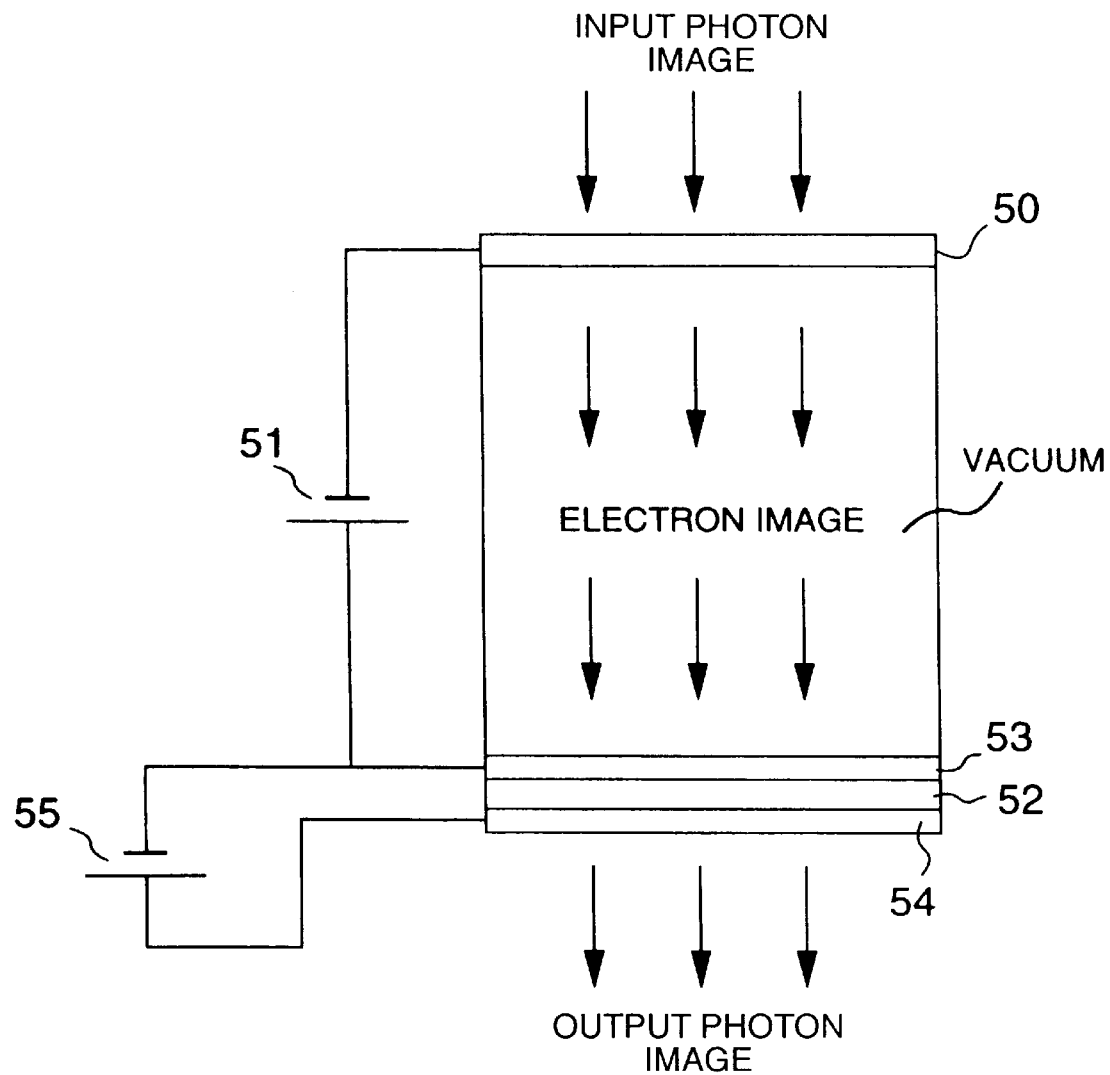
FIG. 8 is a schematic diagram showing an example of the application of this invention to an image intensifier.

Next, an embodiment of an image intensifier will be described. The fundamental structure of an image intensifier is shown in FIG. 8. In the image intensifier, an input photon image is converted into an electron image at a photo-cathode 50. The electron image is applied with a d.c. voltage 51 and converted again into an output photon image by a scintillator 52. In this case, since the electron image accelerated by a high voltage enters the scintillator 52, if the electron beam is spread therein, the resolution is degraded. Therefore, in this embodiment, the scintillator is provided with an electrode 53 and a transparent electrode 54 and a d.c. voltage is applied therebetween to improve the resolution.

6th Embodiment

Figure 9:
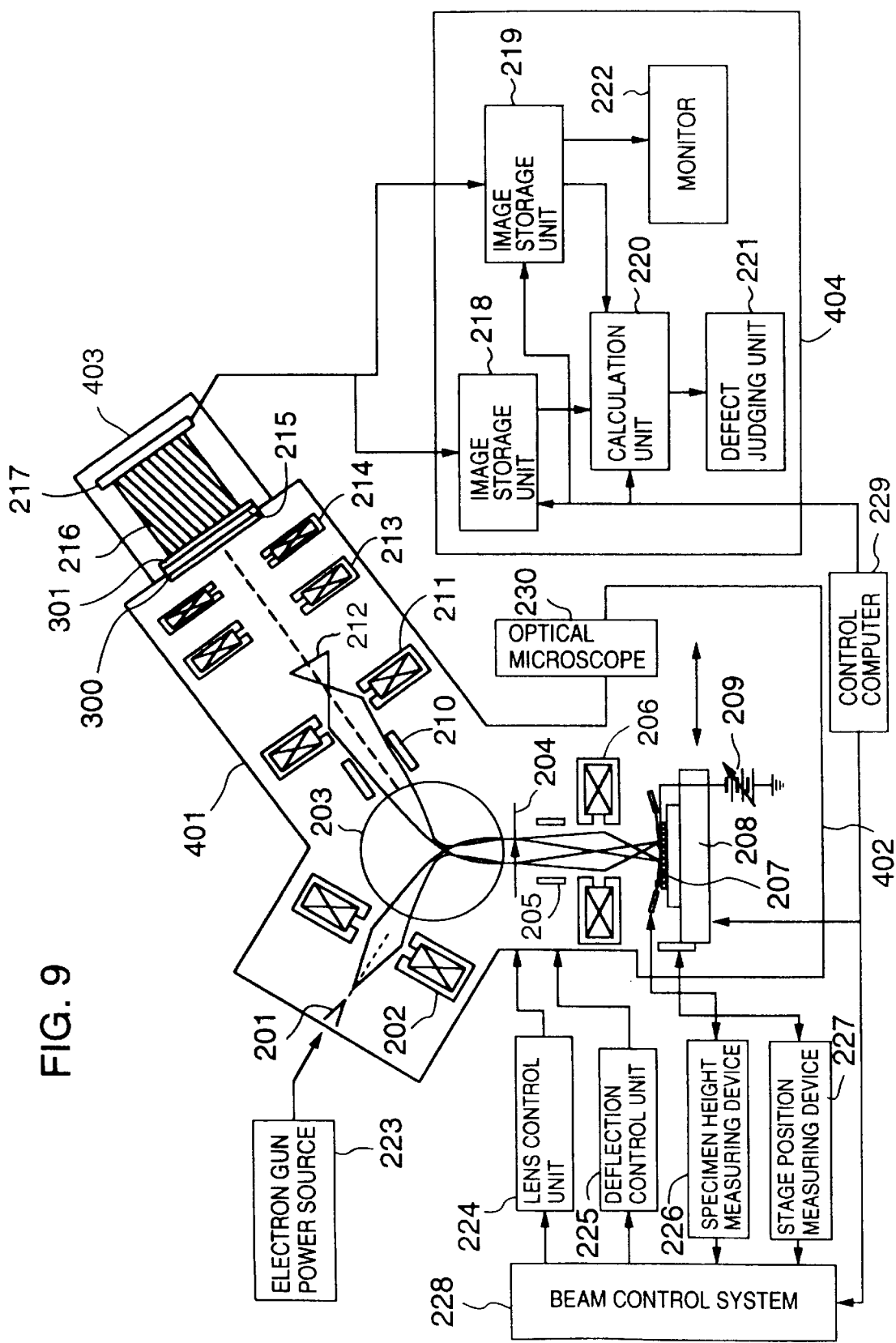
FIG. 9 is a diagram showing an example of the application of this invention to a semiconductor inspection apparatus.

In this embodiment, the invention is applied to an electron beam inspection system for semiconductor devices. FIG. 9 shows the structure of this electron beam inspection system. An electron beam radiated from an electron gun 201 is incident upon a semiconductor specimen 207. Scattered electron beams are guided by an electromagnetic deflector 203 to a focusing system, magnified by magnifying lenses 213 and 214, and thereafter impinged upon a scintillator plate 215. The scintillator plate 215 converts the electron image into a photon image which is guided via an optical fiber plate 216 to a CCD 217 to pick up the image. Since scattered electron beams are in a high energy state, they are also scattered in the scintillator plate 215 to make the image picked up by CCD 217 unsharp. In this embodiment, therefore, the scintillator plate 215 is provided with an electrode 300 and a transparent electrode 301 sandwiching the scintillator plate 215 and a d.c. voltage is applied therebetween, with the transparent electrode 301 being applied with the positive potential. In this manner, the resolution of the image picked up with CCD 217 can be improved greatly.

Various kinds of particle beams having two-dimensional information or particle-beam-induced secondary charged particle beams are controlled so as not to spread in the direction perpendicular to the incident axis by applying a voltage to the scintillator. In the case of electron microscopy in particular, scattering and spread of low-energy electron beams, which have a large influence upon degradation of the resolution and S/N ratio, are suppressed, and in addition a thick scintillator is used to realize a high scintillation output while maintaining a high resolution and a high S/N ratio.

The structure of the system shown in FIG. 9 will be detailed.

This system is mainly constituted of an electrooptic system 401, a specimen chamber 402, an image detector unit 403, an image processing unit 404, and a controller.

First, the electrooptic system 401 will be described. An electron beam emitted from an electron source 201 applied with a high negative voltage by an acceleration power source 223 is converged by a condenser lens 202 and applied to a rectangular aperture 204. This electron beam is deflected by the electromagnetic deflector 203 before it is focused. The electromagnetic deflector 203 is used for separating the optical paths of an input electron beam and an electron beam reflected from the specimen. The electron beam passed through the rectangular aperture 204 forms a rectangular aperture image on the semiconductor specimen 207 via an objective lens 206. The size of the rectangular aperture is 400 μm square which is reduced by ¼ by the objective lens and becomes 100 μm square on the semiconductor specimen. This 100 μm square radiation area can be moved to any desired area of the semiconductor specimen by a scan deflector 205 or can be scanned as desired by the scan deflector 205. The electron source 201 is made of a LaB$_6$ thermoelectron source having a flat tip of 10 μm square or larger. With this electron source, electron beams can be applied uniformly to a large area.

A negative potential lower or slightly higher than the potential of the power source 223 is applied by a power source 209 to the semiconductor specimen 207 and to a specimen support stage 208. If a negative potential lower than the potential of the power source 223 is applied, inspection is performed by using backscattering electrons in which an electron beam is decelerated just before the specimen 207, impinges upon the specimen, and is scattered by atoms on the specimen surface. These scattered electrons are guided to a focusing system by the electromagnetic deflector 203. The focused image is then magnified by the magnifying lenses 213 and 214 so that a microscopic image reflecting the pattern on the semiconductor specimen surface is projected on the scintillator plate 215.

In the specimen chamber 402, the semiconductor specimen 207 is placed on the specimen support stage 208 and a negative high voltage is applied to the specimen 207 and its support stage 208. A stage position measuring device 227 is provided for this stage 208 in order to measure a correct stage position in real time so that an image can be obtained by continuously moving the stage 208. For example, a laser interferometer is used for the stage position measuring device 227. An optical specimen height measuring device 226 is also provided in order to measure a correct height of the wafer. For example, this device 226 obliquely applies light to an inspection area of the wafer and measures the height of the wafer in accordance with a change in the position of reflected light.

Next, the image detector unit 403 will be described which is constituted of the scintillator plate 215 and CCD 217. The electrode 300 and transparent electrode 301 are attached to both sides of the scintillator plate 215. A high voltage is applied between the electrodes to prevent the electron beam from being scattered, and the scintillator plate 215 and CCD 217 are optically coupled by the optical fiber plate 216 to focus the optical image on the optical image detecting element. Alternatively, the optical fiber plate 216 may be replaced by an optical lens to focus an image on the semiconductor specimen surface formed on the scintillator plate 215 onto CCD 217. An electric signal image obtained by CCD 217 is sent to the image processing unit 404.

The image processing unit 404 is constituted by image storage units 218 and 219, a calculation unit 220, and a defect judging unit 221. The input image is displayed on a monitor 222. An operation instruction and condition supplied from each unit of this system is transferred to and from a control computer 229. The control computer 229 is previously supplied with various parameters, including an acceleration voltage of an electron beam, an electron beam deflection width, a specimen support stage moving speed, a detector signal fetch timing, and the like. In accordance with signals supplied from the stage position measuring device 227 and specimen height measuring device 226, correction signals are calculated and sent to the objective lens 206 and scan deflector 205 in order to apply an electron beam always to a correct position. Under the control of the control computer 229, a unit 228 transfer signals to and from the lens control unit 224 for controlling an electron beam, the deflection control unit 225 for controlling the deflector, the specimen height measuring unit 226, and the stage position measuring unit 227. Reference numeral 230 represents an optical microscope, and reference numeral 212 represents a position of a magnified image of the secondary electron image of the specimen.

What is claimed is:

1. A scintillator device and an image pickup apparatus using the scintillator, the scintillator device comprising:
   a scintillator for converting a particle beam into a light beam, in which a voltage is applied to desired planes of the scintillator to thereby control a spread area of a charged particle beam in the scintillator.

2. A scintillator device and an image pickup apparatus using the scintillator according to claim 1, wherein said voltage is applied to desired planes of the scintillator to thereby reduce a scintillation area of the scintillator as compared to when a voltage is not applied.

3. A scintillator device and an image pickup apparatus using the scintillator according to claim 1, wherein the particle beam is one of a photon beam, an ion beam, an atom beam, a molecular beam and an electron beam.

4. A scintillator device and an image pickup apparatus using the scintillator according to claim 1, wherein the desired planes are an input plane of the particle beam and an output plane of scintillation.

5. A scintillator device and an image pickup apparatus using the scintillator according to claim 4, wherein an electrode film is provided for the input plane of the particle beam.

6. A scintillator device and an image pickup apparatus using the scintillator according to claim 5, wherein a transparent electrode is provided for the output plane of scintillation.

7. A scintillator device and an image pickup apparatus using the scintillator according to claim 6, wherein the transparent electrode is made of a material selected from a group consisting of tin oxide ($SnO_2$), indium oxide ($In_2O_3$) and titanium oxide ($TiO_2$), or made of a compound thereof.

8. A scintillator device and an image pickup apparatus using the scintillator according to claim 5, wherein the electrode film formed at the input plane of the particle beam is a metal film having a large transmission capability of an electron and a large light reflectivity to provide both an electrode function and a light reflecting function.

9. A scintillator device and an image pickup apparatus using the scintillator according to claim 8, wherein the metal film electrode is made of aluminum (Al), silver (Ag), gold (Au), or platinum (Pt).

10. A scintillator device and an image pickup apparatus using the scintillator according to claim 1, wherein the voltage applied to the scintillator is a positive potential at an input plane of the particle beam and a negative potential at an output plane of scintillation if the charged particle beam has positive charges in the scintillator, and is a negative potential at the input plane of the particle beam and a positive potential at the output plane of scintillation if the charged particle beam has negative charges in the scintillator.

11. A scintillator device and an image pickup apparatus using the scintillator according to claim 10, wherein an electrode film is provided for the input plane of the particle beam.

12. A scintillator device and an image pickup apparatus using the scintillator according to claim 11, wherein a transparent electrode is provided for the output plane of scintillation.

13. A scintillator device and an image pickup apparatus using the scintillator according to claim 12, wherein the transparent electrode is made of a material selected from a group consisting of tin oxide ($SnO_2$), indium oxide ($In_2O_3$) and titanium oxide ($TiO_2$), or made of a compound thereof.

14. A scintillator device and an image pickup apparatus using the scintillator according to claim 11, wherein the electrode film formed at the input plane of the particle beam is a metal film having a large transmission capability of an electron and a large light reflectivity to provide both an electrode function and a light reflecting function.

15. A scintillator device and an image pickup apparatus using the scintillator according to claim 14, wherein the metal film electrode is made of aluminum (Al), silver (Ag), gold (Au), or platinum (Pt).

16. A scintillator device and an image pickup apparatus using the scintillator according to claim 1, wherein for the voltage applied to the scintillator, an input plane of the particle beam is electrically grounded.

17. A scintillator device and an image pickup apparatus using the scintillator according to claim 1, wherein the scintillator is a scintillator of an image intensifier which converts an input photon image into an electron image at a photo-cathode and converts the electron image into an output photon image in the scintillator by applying a voltage between an electrode film and a transparent electrode to improve the resolution of said output photon image.

18. An image pickup apparatus comprising:

first and second electrodes for applying a voltage;

a scintillator disposed between the first and second electrodes for converting a charged particle beam passed through the first electrode into a light beam, in which the voltage is applied between the first and second electrodes to thereby control a spread area of the charged particle beam in the scintillator;

a photosensor for detecting the light beam output from the scintillator; and an optical member disposed between the scintillator and the photosensor.

* * * * *